(12) United States Patent
Kennelly

(10) Patent No.: US 9,953,771 B2
(45) Date of Patent: Apr. 24, 2018

(54) HEAT DISSIPATION FROM ACB TOES

(71) Applicant: Anord Control Systems Limited, Dundalk, Louth (IE)

(72) Inventor: Patrick Kennelly, Dublin (IE)

(73) Assignee: Anord Control Systems Limited, Dundalk (IE)

( * ) Notice: Subject to any disclaimer, the term of this patent is extended or adjusted under 35 U.S.C. 154(b) by 0 days.

(21) Appl. No.: 15/299,896

(22) Filed: Oct. 21, 2016

(65) Prior Publication Data

US 2017/0117103 A1    Apr. 27, 2017

(30) Foreign Application Priority Data

Oct. 21, 2015    (GB) .................................. 1518660.4

(51) Int. Cl.
| | | |
|---|---|---|
| *H01K 1/66* | (2006.01) | |
| *H01H 1/62* | (2006.01) | |
| *H05K 7/20* | (2006.01) | |

(52) U.S. Cl.
CPC ........... *H01H 1/62* (2013.01); *H05K 7/20127* (2013.01); *H05K 7/20309* (2013.01); *H05K 7/20318* (2013.01); *H05K 7/20336* (2013.01); *H05K 7/20381* (2013.01); *H05K 7/20409* (2013.01)

(58) Field of Classification Search
CPC ............... H01H 2009/525; H01H 1/62; H01H 2009/52; H01H 1/623; H05K 7/20336
See application file for complete search history.

(56) References Cited

U.S. PATENT DOCUMENTS

| | | | |
|---|---|---|---|
| 5,203,399 A | | 4/1993 | Koizumi |
| 5,921,315 A | * | 7/1999 | Dinh ........................ F24F 3/153 |
| | | | 165/104.14 |
| 6,018,455 A | * | 1/2000 | Wilkie, II ................. H02B 1/21 |
| | | | 165/80.3 |

(Continued)

FOREIGN PATENT DOCUMENTS

EP    2224561    9/2010

OTHER PUBLICATIONS

Anord Control Systems Limited, European Patent Application No. GB1518660.4, European Examination Report dated Apr. 21, 2016, 3 pages.

(Continued)

*Primary Examiner* — Cassey D Bauer
(74) *Attorney, Agent, or Firm* — Brian S. Steinberger; Law Offices of Brian S. Steinberger, P.A.

(57) ABSTRACT

A heat dissipation apparatus, system and method for an air circuit breaker (ACB) switchgear has at least one pair of primary contact toes constructed and arranged to connect to a terminal of the circuit breaker. A bus bar joint is connected to the primary contact toes. The heat dissipation apparatus comprises an evaporator clamped to the primary contact toes. A condenser is located at a higher elevation than the evaporator and at least two electrically isolating pipes fluidly connect the evaporator with the condenser. A dielectric fluid in the evaporator can be heated to a vapor state, with one of the pipes transferring the vapor to the condenser and the second pipe returning the condensed dielectric fluid back to the evaporator for cooling the at least one pair of primary contact toes.

12 Claims, 7 Drawing Sheets

(56) References Cited

U.S. PATENT DOCUMENTS

| | | | |
|---|---|---|---|
| 8,792,226 B2* | 7/2014 | Dhar | H02B 1/56 165/104.26 |
| 2003/0205363 A1 | 11/2003 | Chu et al. | |
| 2013/0319024 A1 | 12/2013 | Fischer-Carne | |
| 2015/0124381 A1 | 5/2015 | Wu | |

OTHER PUBLICATIONS

Anord Control Systems Limited, European Search Report for European Application No. 16194918.5-1808 dated Mar. 1, 2017, 8 pages.

* cited by examiner

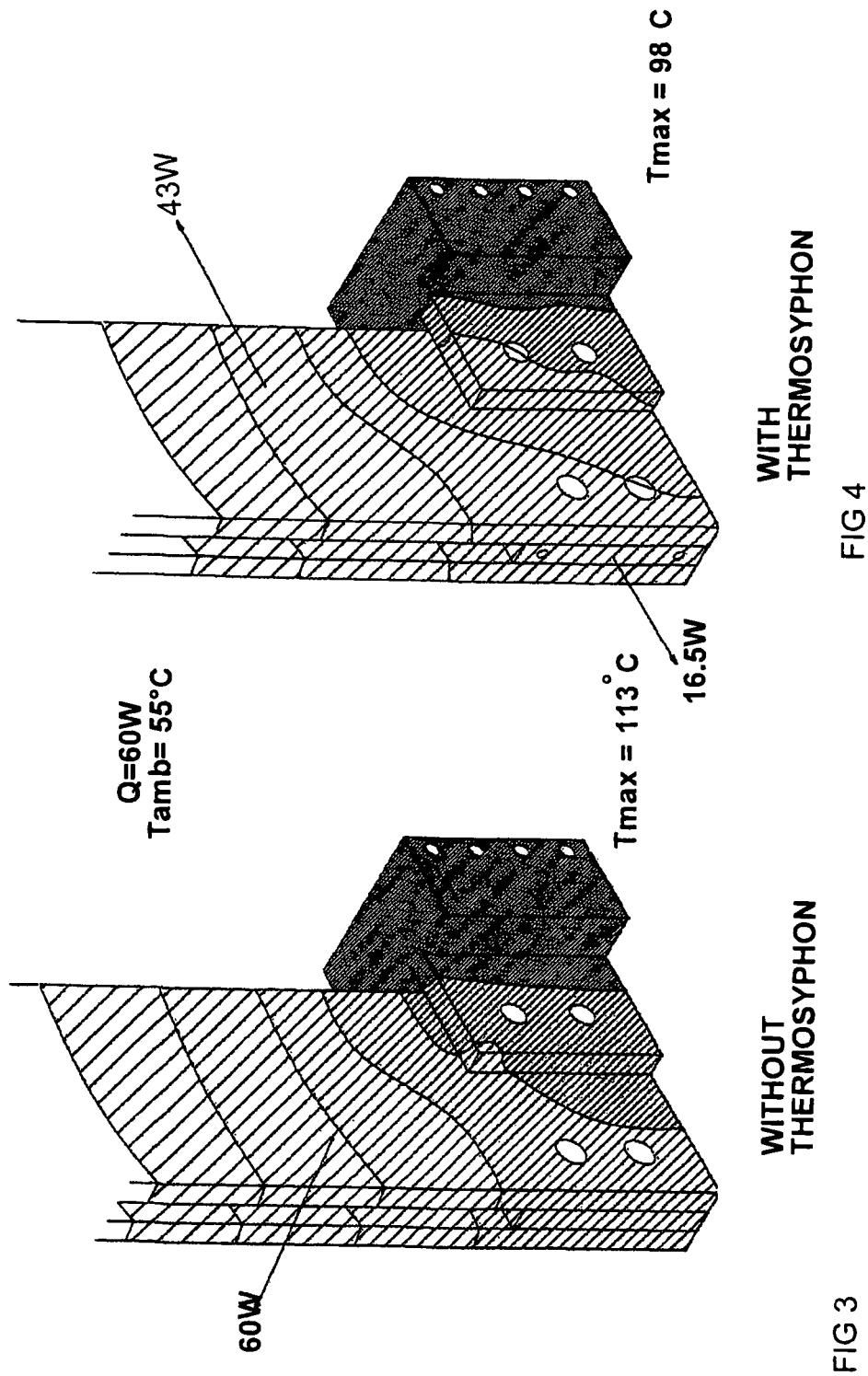

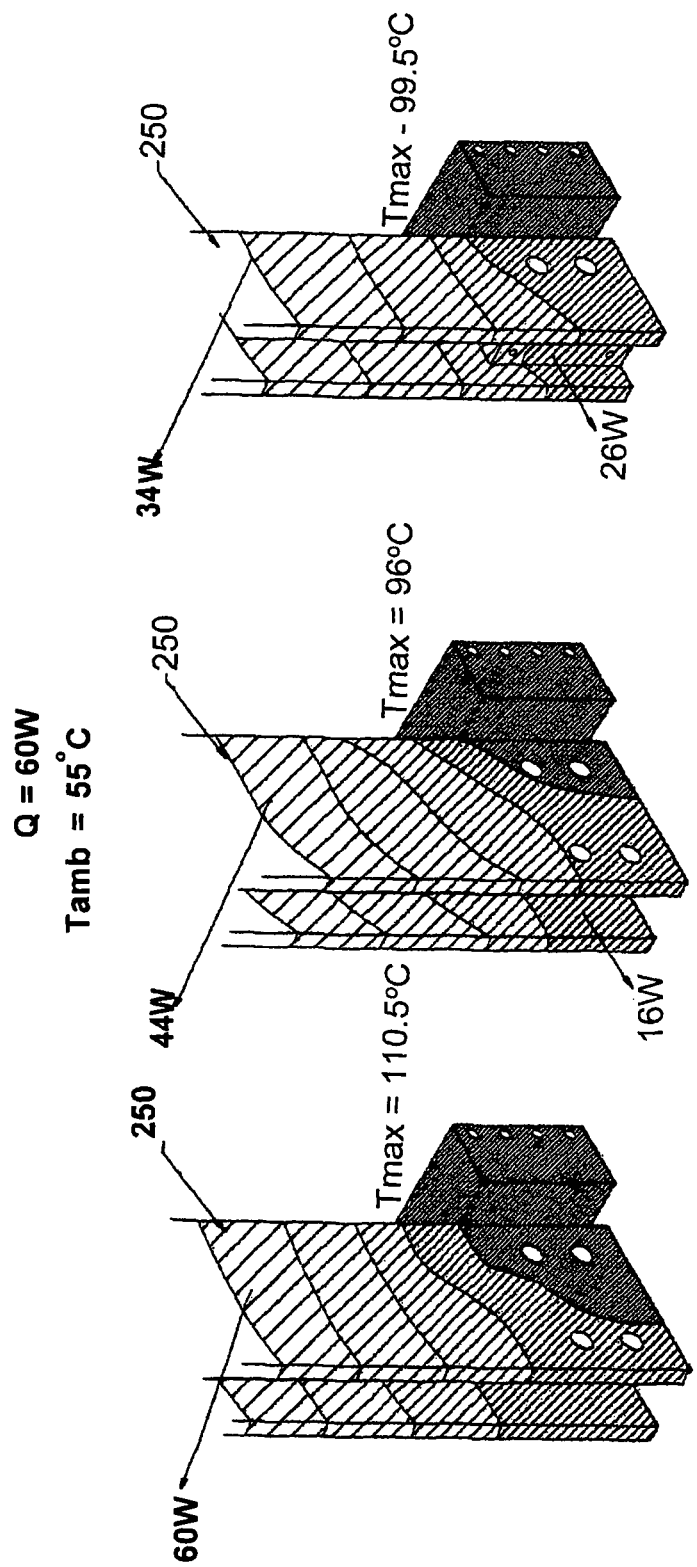

HEAT DISSIPATION FROM ACB TOES

This application claims the benefit of foreign priority to United Kingdom Patent Application No. 1518660.4 filed Oct. 21, 2015, which is incorporated by reference in its' entirety.

FIELD OF INVENTION

The present invention relates apparatus, systems and methods to provide heat dissipation from air circuit breaker (ACB) toes used in low voltage installations, i.e. up to 1000 v AC, 1500 v DC.

BACKGROUND AND PRIOR ART

Air circuit breaker (ACB) switchgears can generate heat that can cause damage to the switchgear as well as to surrounding structures, and solutions are needed for these problems.

SUMMARY OF THE INVENTION

The present invention provides a heat dissipation apparatus for an air circuit breaker (ACB) switchgear having at least one pair of primary contact toes constructed and arranged to connect to a terminal of the circuit breaker, with a bus bar joint being connected to the primary contact toes, the heat dissipation apparatus comprising an evaporator constructed and arranged to be clamped to the primary contact toes, a condenser located at a higher elevation than the evaporator, at least two electrically isolating pipes fluidly connecting the evaporator with the condenser, a bus bar joint, and a dielectric fluid in the evaporator adapted to be heated to a vapor state, with one of the pipes being constructed and arranged to transfer the vapour to the condenser and the second pipe being arranged to return the condensed dielectric fluid back to the evaporator for cooling the at least one pair of primary contact toes.

The condenser may include a plurality of fins in spaced relation, with the fins transferring heat from the condenser to surrounding air by natural convection.

Conveniently, the fins of the condenser are metal and disposed substantially parallel to one another.

Ideally, the evaporator is manufactured from copper or aluminum and has an internal fluid path for the dielectric fluid.

Advantageously, the condenser is generally flat and includes a tubular arrangement of an elongate pipe formed into a plurality of U-shaped formations arranged to provide a thermosyphon effect for the efficient cooling of the dielectric fluid in the condenser.

Preferably, the evaporator is clamped to the primary contact toes by means of at least one nut and bolt extending through an orifice in the evaporator.

The present invention also provides a method of dissipating heat from an air circuit breaker (ACB) switchgear having at least one primary pair of contact toes constructed and arranged to connect to the terminal of a circuit breaker, with a bus bar joint being connected to the primary contact toes, the method comprising the steps clamping an evaporator to the primary contact toes, providing a condenser located at a higher elevation than the evaporator, providing at least two electrically isolating pipes fluidly connecting the evaporator with the condenser, and providing a dielectric fluid in the evaporator, transferring heat from the primary contact toes to the working fluid to cause the dielectric fluid to evaporate in the evaporator with the evaporated vapour being delivered to the condenser via one of the pipes and returning the dielectric fluid that condenses in the condenser back to the evaporator via the second pipe.

Further objects and advantages of this invention will be apparent from the following detailed description of the presently preferred embodiments which are illustrated schematically in the accompanying drawings.

BRIEF DESCRIPTION OF THE FIGURES

The invention will hereinafter be more particularly described with reference to the accompanying drawings which show, by way of example only, two embodiments of a heat dissipation apparatus for ACB toes in accordance with the invention. In the drawings:

FIGS. 3 and 4 are two perspective views of two ACB toes showing the heat profile across the toes without a thermosyphon and with a thermosyphon;

FIG. 5 is a perspective view of the heat profile on a standard pair of bus bars with no thermosyphon;

FIG. 6 is a perspective view of the heat profile on a standard pair of bus bars with a thermosyphon;

FIG. 7 is a perspective view of the heat profile on a smaller pair of bus bars with a thermosyphon;

DESCRIPTION OF THE PREFERRED EMBODIMENTS

Before explaining the disclosed embodiments of the present invention in detail it is to be understood that the invention is not limited in its applications to the details of the particular arrangements shown since the invention is capable of other embodiments. Also, the terminology used herein is for the purpose of description and not of limitation.

In the Summary above and in the Detailed Description of Preferred Embodiments and in the accompanying drawings, reference is made to particular features (including method steps) of the invention. It is to be understood that the disclosure of the invention in this specification does not include all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

Figure 1:
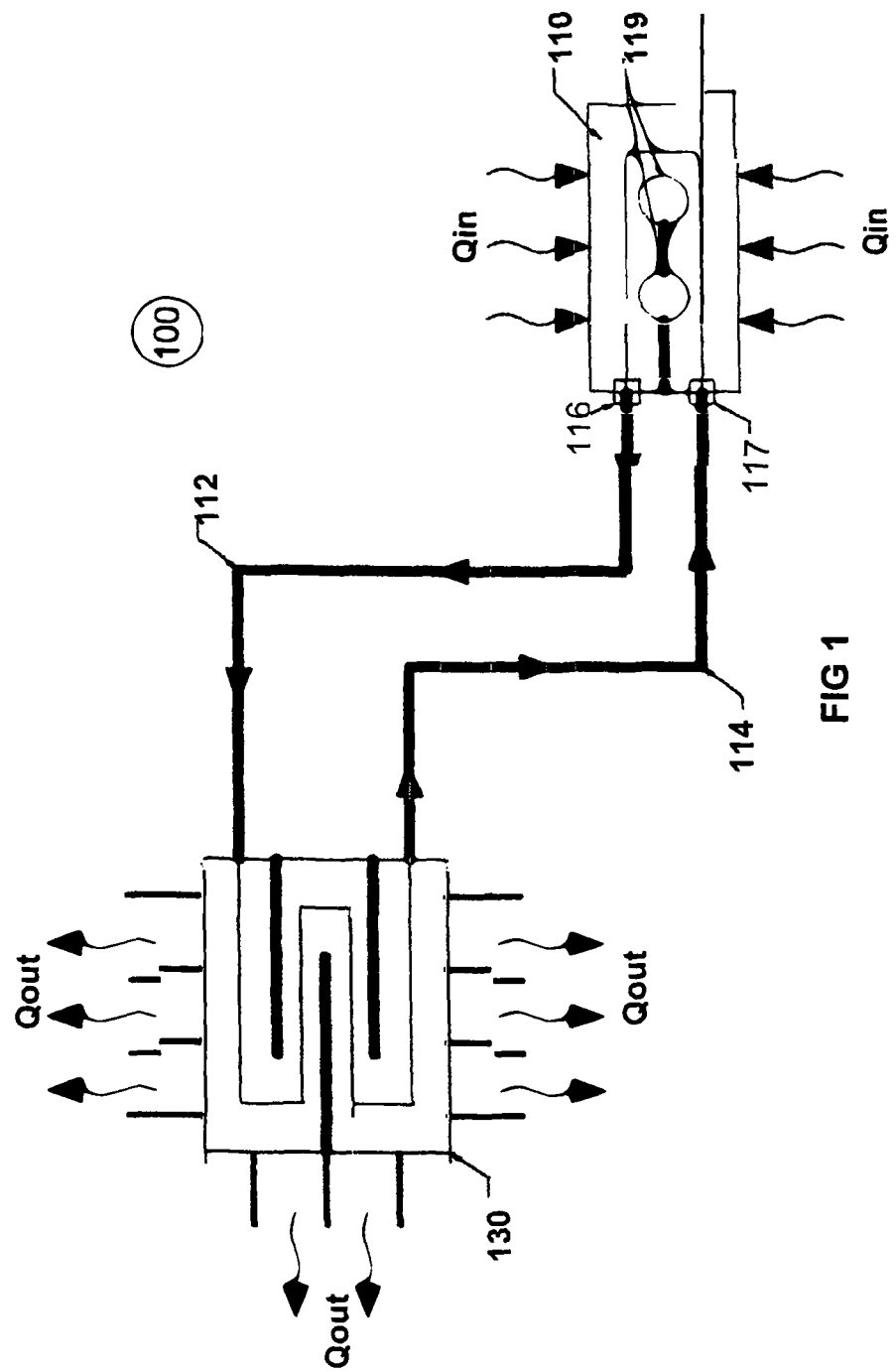
FIG. 1 is a perspective view of a first embodiment of a heat dissipation apparatus for ACB toes.
Figure 2:
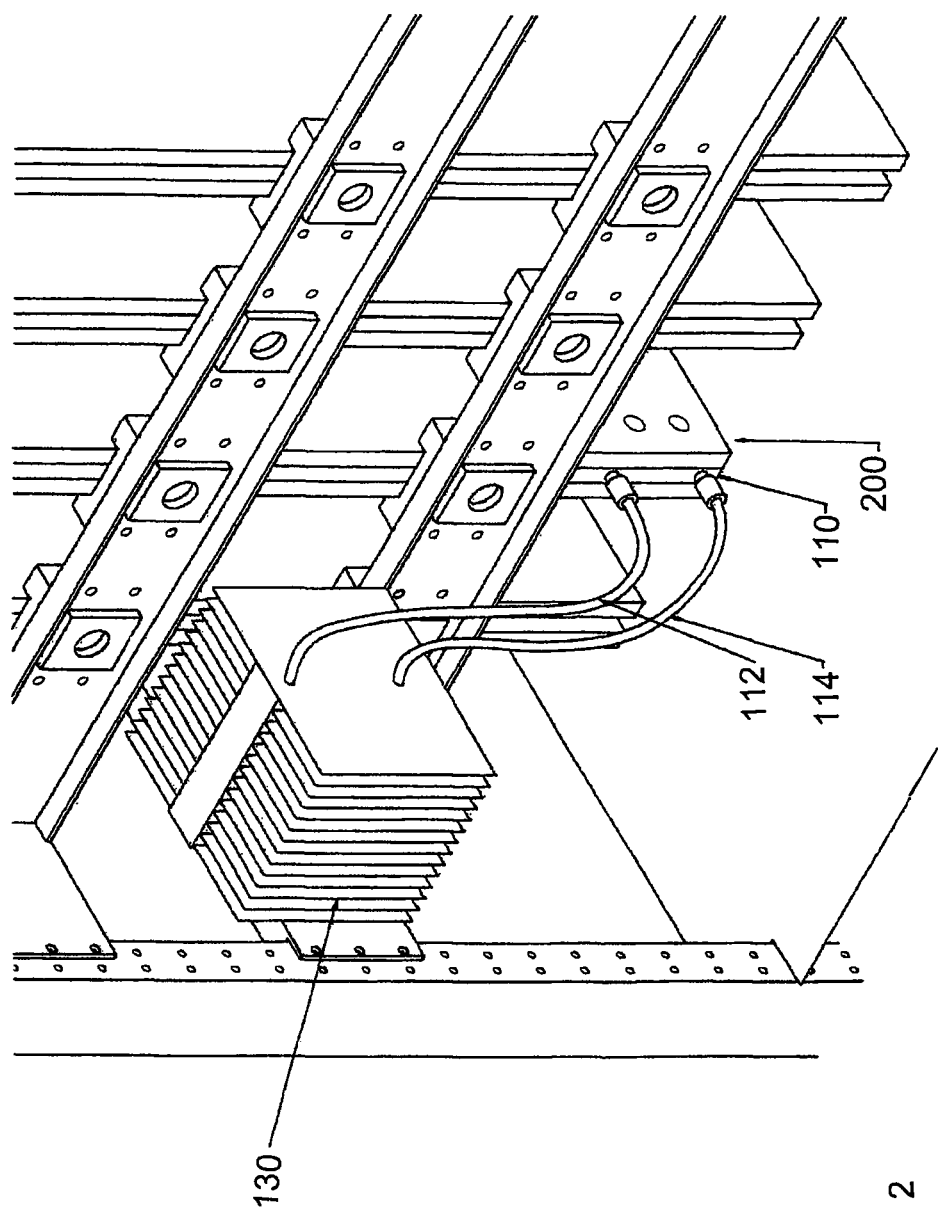
FIG. 2 is a perspective view of the first embodiment integrated in a cabinet.

Referring to the drawings and initially to FIGS. 1 to 2, the heat dissipation apparatus 100 of the invention comprises an evaporator 110 for clamping between the toes 200 of an ACB, a fin type condenser 130, a pipe 112 for conducting heated vapour from the evaporator 110 to the condenser 130 and a return pipe 114 for conducting cooled fluid back from the condenser 130 to the evaporator 110. The condenser 130 is provided on a support within cabinet 210.

Figure 9:
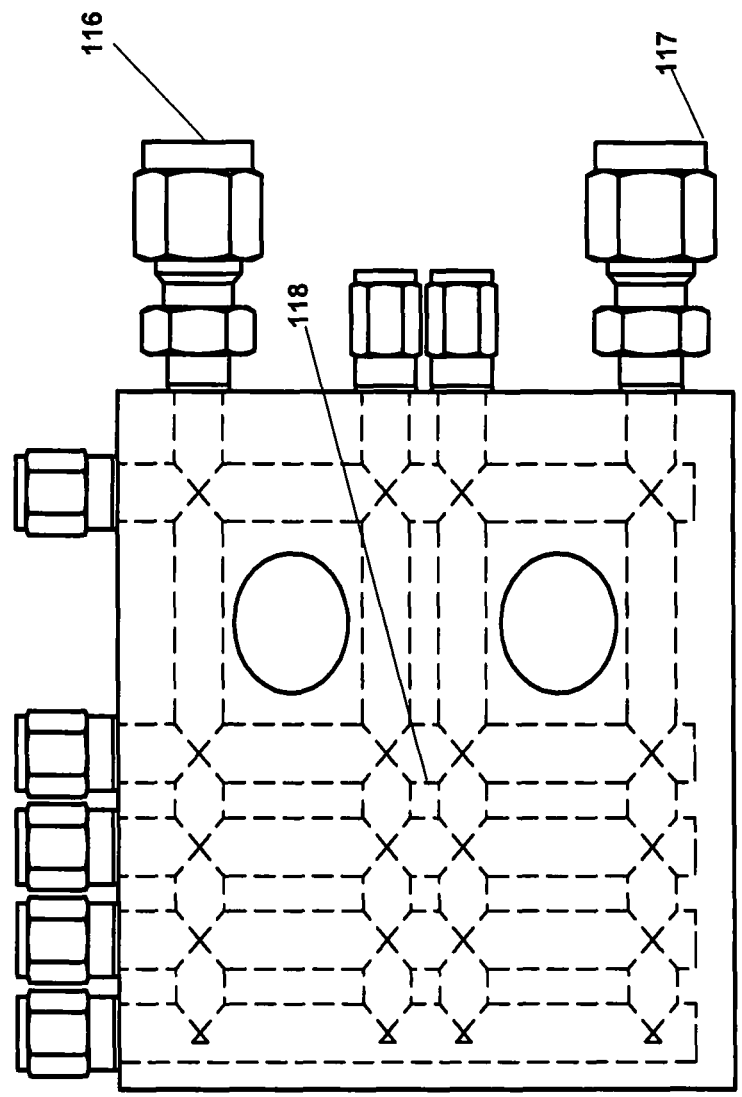
FIG. 9 is a side view of the evaporator showing the fluid path in dotted view.

The evaporator 110 as shown in FIGS. 1, 2 and 9 comprises a copper block having an upper port 116 for the pipe 112 and a lower port 117 for the pipe 114. An internal fluid path 118 extends between the upper connection 116 and the lower connection 117 for the passage of a low thermal conductivity dielectric fluid, through the evaporator.

Figure 10:
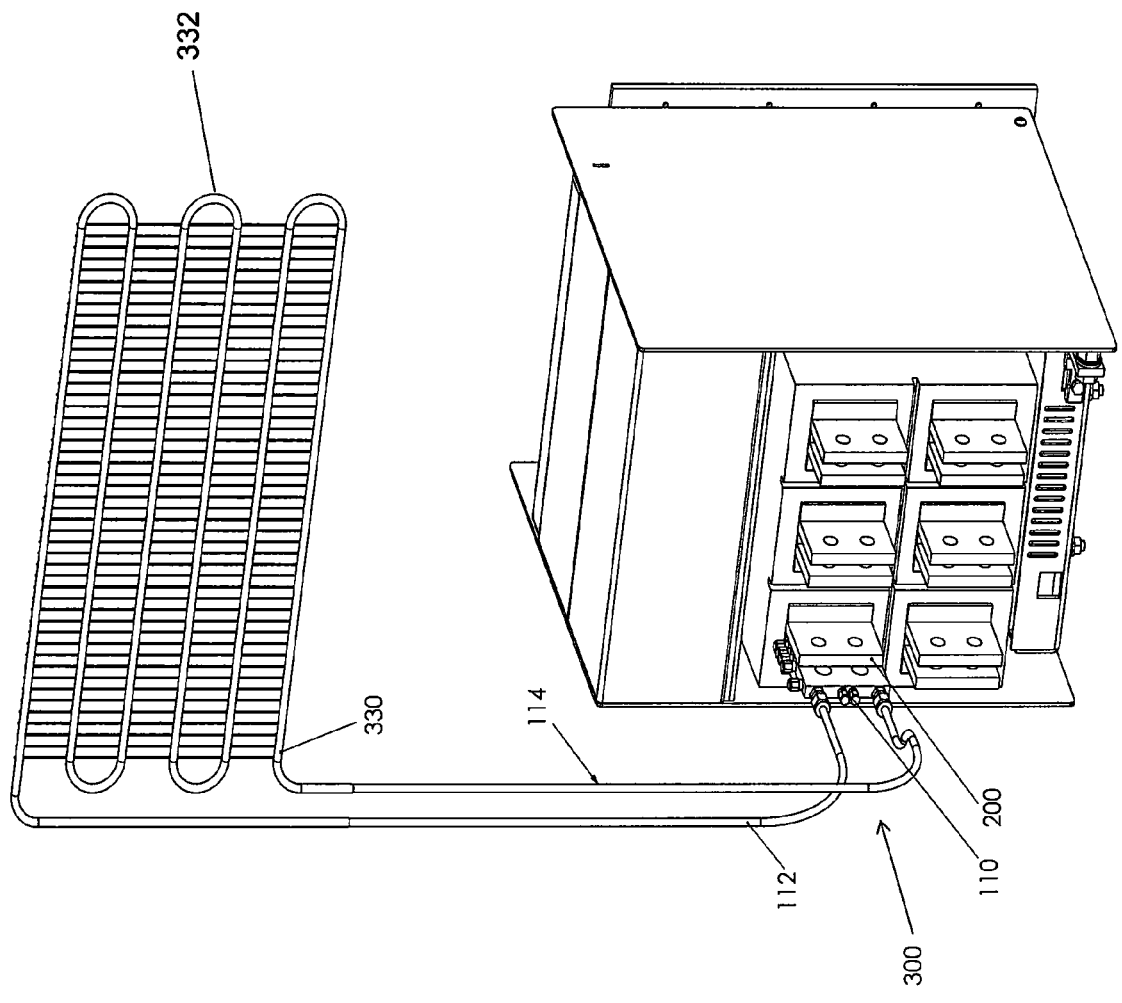
FIG. 10 is a perspective view of a second embodiment of a heat dissipation apparatus for ACB toes.

In the second embodiment shown in FIG. 10, heat dissipation apparatus 300 is similar to the first embodiment 100 except that a flat tubular condenser 330 replaces the fin type condenser 130.

The heat dissipation apparatus 100 and 300 is a two phase heat exchanger for dissipating heat from ACB toes. Even with a low thermal conductivity dielectric fluid (FC 72) the dissipation of heat is effective. For an applied power of 60 W and an ambient air temperature of 55° the cooling solution should keep the toes below the required threshold of 120° C.

One crucial component, is the integration of the heat collecting evaporator into the toe-bus bar system. FIG. 2 shows the first working embodiment. The bus bars are fastened to the toe by two bolts fitted into holes 119. The bus bars protrude from the toe and have an additional two bolt holes positioned so as to tightly clamp the evaporator ensuring good thermal and mechanical contact. The evaporator 110 is fabricated from a single block of copper by machining connecting voids where boiling of the dielectric fluid will occur. This ensures adequate strength and is straight forward and inexpensive to manufacture. The ports 116 and 117 allow for the flow and return of the working dielectric fluid.

Preliminary FE results of the region near the toe are shown in FIGS. 5 and 6. The results indicate that even with the thermosyphon evaporator in place there is still considerable heat transfer from the bus bars. For the given simulation environment the bus bars provide a path of low thermal resistance due to their large cross-sectional and surface areas. They thus "starve" the thermosyphon and the initial simulations indicate that they in fact transport around ⅔ of the heat and dissipate it into the enclosure.

Figure 8:
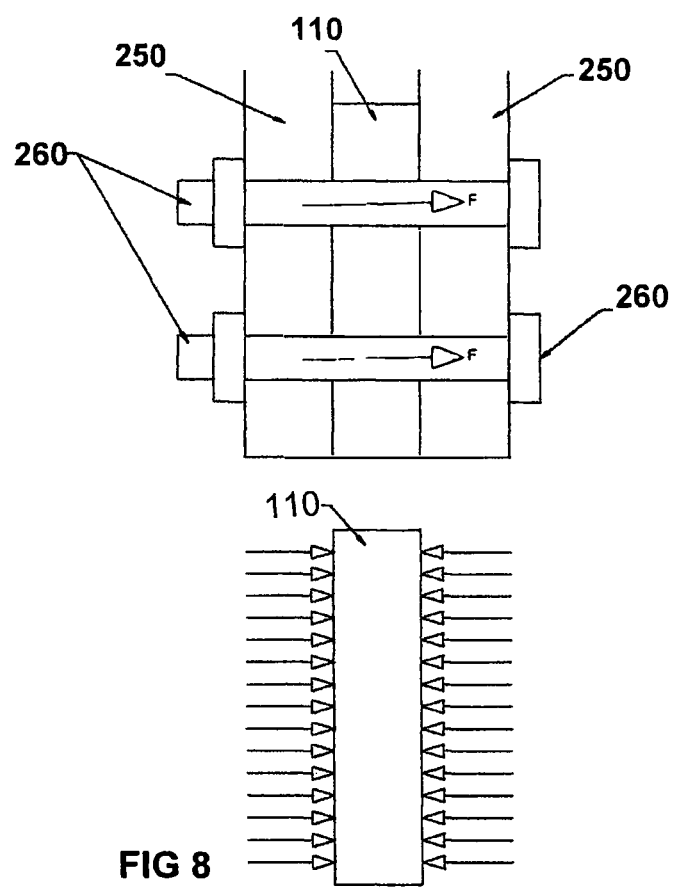
FIG. 8 is a cross-sectional view through an installation showing how the evaporator is sandwiched between two cooler bus bars of an ACB toe.

The evaporator 110 is designed to be sandwiched between the two copper bus bars 250 which carry current from the ACB and tightly clamped by two bolts 260 as shown in FIG. 8.

The working fluid must be dielectric, non-hazardous (UL listed), chemically stable, suitable for two phase applications, have a crucial temperature—200° C. and chemically compatible with copper and a dielectric and UL listed material.

One suitable working fluid is 3M (Trade Mark) FLUORINERT (Trade Mark) Electronic Liquid FC-72 which is a clear, colourless, fully fluorinated liquid. Like other Fluorinent electronic liquids, Fluorinert liquid FC-72 is thermally and chemically stable, compatible with sensitive materials, non-flammable, practically non-toxic and leaves essentially no residue upon evaporation. This unique combination of properties makes Fluorinert liquid FC-72 ideal for many electronics applications, including quality and reliability testing.

Fluorinert Liquid FC-72 conforms to Military Specification 883 as a detector fluid in a vacuum/pressure vessel used in gross leak testing. Its inert nature makes FC-72 liquid a useful reaction medium.

The main features of the heat dissipation apparatus 100 are with reference to FIG. 2:

1. The evaporator 110 has been designed to be fully integrated between the copper bus bars 250 to allow for easy plumbing to the condenser 130.
2. The working fluid is a dielectric (possible fluids are FC 72 and R123).
3. The condenser 130 is provided with a large surface area for condensation which necessitates a looped thermosyphon concept.

For the looped thermosyphon, the vapour is expelled from the top port 116 of the evaporator 110 and a vapour connecting line 112 connects it with the condenser 130. Here the vapour is fully condensed and the liquid is returned to the bottom port of the evaporator. The connecting pipes 112 and 114 between the evaporator 110 and the condenser 130 is dielectric material thus offering electrical isolation between the toe and the remote heat sink.

A large amount of heat still flows through the bus bars 250. This is expected due to the ease at which heat can flow through the large copper bars to a fairly large surface area, together offering a path of low thermal resistance.

The size of the bus bars may be reduced without a detrimental influence on the toe temperature i.e. the heat is simply channelled through the thermosyphon. A large portion of the heat may be dissipated by the bus bars. This reduces the heat flux at the evaporator of the thermosyphon and may cause start-up problems. The fluid is dielectric and compatible with plastics and elastomers (for connecting the evaporator to the condenser) and will provide sufficient electrical isolation.

The specified total power loss (or thermal dissipation requirements) for this ACB variant is 330 W. This translates to approximately 110 W per pole. There are two toes per pole however, since the top toe tends to be hotter, 330/3=110 W/pole with 60 W dissipated by the top toes and 50 W dissipated at the bottom toe.

The temperature of the toes must not exceed 120° C. measured at a point on the toe near to the heat source.

Evaporator 110:

The invention is used to mitigate excessive temperatures caused by the thermal contact resistance at the ACB specifically. The evaporator is designed specifically to be clamped to the toe-bus bar assembly as it is closest that an externally mounted cooling system can get to the actual break where the thermal contact resistance is generating the undesired heat. The main target is to provide very effective local passive cooling so that the volume of copper (of the bus bars), which are currently the main heat dissipation structures, can be significantly reduced. This requires a very specific thermal-mechanical design compared with a technology which is simply attempting to cool the bus bars themselves i.e. where they are attempting to absorb and transfer the heating within the bus bars caused by the current flowing within them.

The evaporator 110 is constructed from a single solid block of metal, copper in this instance. Cross-hatched channels are fabricated by drilling partially through the blocks from the top and one side. The novelty and benefits of this concept are:

1. It has a high internal (wetted) surface area. This reduces the boiling thermal resistance.

2. Heat can easily spread throughout the solid portions of the block so all of the internal wetted surface is heated, even if heated from one side.

3. It is symmetrical so can absorb and distribute heat equally when heated from two sides.

4. Compared with a single serpentine channel, the cross-hatched concept has a higher open flow area which results in a lower pressure drop due to the lower flow velocities. Related to this, the boiling heat transfer mechanisms will be nucleate boiling which is preferred compared with the single channel boiling flow regimes such as stratified flow and slug-plug flow.

5. It is simple to manufacture and thus low cost.

6. Sealing is facilitated by high pressure/vacuum threaded seals which will mitigate leaks or potential air ingress so improves reliability.

7. Using a single block of metal results is very high mechanical strength when pressed from the sides. When the evaporator 110 is compressed under 10.5 MPa of applied pressure it results in a Factor of Safety of approximately two over yield strength of copper and the maximum deformation is only 10 micrometers.

8. The high mechanical strength thus facilitates mounting directly to the toe-bus bar assembly which places the heat exchanger as close as possible to the air circuit breaker i.e. as close as possible to the junction where the contact resistance is generating the heat.

9. The high assembly pressure mitigates any thermal contact resistance between the evaporator 110 and the toe/bus bar assembly which improves heat transfer 10. The boiling heat transfer can be enhanced by broaching or gun-barrelling of the drilled wells.

Condenser 330:

The condenser 330 is specifically designed to have a very high aspect ratio i.e. it is much longer than it is wide. The reasons for this are;

1. The thermosyphon operates on the principle of hydrostatic head (gravity force) acting on the liquid which has been generated in the condenser. This is facilitated by having a sufficiently long (top to bottom) condenser 2. The condenser is primarily composed of horizontal tubes 332. For natural convection heat transfer, the heat transfer coefficient (effective thermal conductance) of horizontal tubes is 2 to 3 times greater than straight vertical fins. This results in much lower thermal resistance for the same effective surface area or a much more compact system for the same thermal performance.

3. For natural convection heat exchangers, electromagnetic radiation can be as important a mode of heat transfer as natural convection provided the emissivity and view factors of the surface is high. The condenser system here is mat-black providing a very high (~0.95) emissivity. The view factor for a horizontal tube between two vertical walls is considerably higher (approaching unity) than vertical arrays of fins (~0.2). Thus, the radiation heat transfer is of the same approximate magnitude as the natural convection heat transfer resulting in a significantly lower thermal resistance for the same effective surface area because two modes of heat transfer are taking part in the thermal exchange process.

4. Simple surface area extensions can be added by welding wires without compromising air flow or compactness.

5. In this concept, the tubes 332 are in essence the extended surface area so there is direct thermal communication between the hottest point and the ambient surroundings. Vertical fin arrangements would require imbedding the channels in a flat base to distribute the heat through the base and conduct the heat to the fins. This would result in a substantial thermal resistance due to constriction and spreading thermal resistances.

Working Fluid:

The choice of working fluid is crucial. In the present invention the preferred fluid is FC 72 for very specific reasons as discussed below.

Apart from being non-toxic, low GWP and dielectric, the working fluid needs very specific thermodynamic properties.

1. The fluid needs a low boiling point compared with the maximum possible temperature, here the maximum toe temperature, but it cannot be too low because this can result in very high pressures when in operation.

2. Related to the above, it requires a critical temperature that is significantly above the maximum possible temperature (max toe temperature) so that the operating pressure in not excessive. For example, R134a as a working fluid, it has a critical temperature of ~100° C. where the (critical) pressure will be close to 40 bar. Therefore, if its operating point was around 60° C., then the operating pressure will be about 17 bar. The working fluid, FC72 (or any with similar thermodynamic properties) will have an operating pressure of slightly above ambient i.e. will be slightly pressurized (~1.3 bar), when operating at 65° C.

3. It is desired that the operating point is pressurized because it will eliminate air ingress into the system (air in the thermosyphon will adversely affect performance and could eventually cause failure). However, the pressure should not be excessive as this may cause leaks or require excessively thick containment, strong materials (stainless steel for example), high pressure fittings etc. which will adversely affect performance, make it heavy and expensive.

The entire system is tuned specifically to ensure that it is marginally pressurized. This is a key novel feature of the design as it just requires changing the overall length of tubing of the condenser i.e. the simple condenser design facilitates straight forward tuning of the thermodynamic operating point (on a case by case basis).

It is to be understood that the invention is not limited to the specific details described herein and that various modifications and alterations are possible without departing from the scope of the invention as defined in the appended claims.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A heat dissipation apparatus for an air circuit breaker (ACB) switchgear having at least one pair of primary contact toes constructed and arranged to connect to a terminal of the circuit breaker, with a bus bar joint being connected to the primary contact toes, the heat dissipation apparatus comprising:

an evaporator clamped to the primary contact toes, a condenser located at a higher elevation than the evaporator, at least two electrically isolating pipes fluidly connecting the evaporator with the condenser, and a dielectric fluid in the evaporator adapted to be heated to a vapour state, with one of the pipes being constructed and arranged to transfer the vapour to the condenser and the second pipe being arranged to return the condensed dielectric fluid back to the evaporator for cooling the at least one pair of primary contact toes, the dielectric fluid being non-hazardous (UL listed), chemically stable, suitable for two phase applications, have a crucial temperature −200° C. and chemically compatible with copper and a dielectric and UL listed material, wherein the evaporator is manufactured from a single solid block of metal and has an internal fluid path for the dielectric fluid that is defined by cross-hatched channels fabricated by drilling partially through the evaporator block from a top side to one side.

2. A heat dissipation apparatus as claimed in claim 1, wherein the condenser includes a plurality of fins in spaced relation, with the fins being arranged to transfer heat from the condenser to surrounding air by natural convection.

3. A heat dissipation apparatus as claimed in claim 2, wherein the fins of the condenser are metal and disposed substantially parallel to one another.

4. A heat dissipation apparatus as claimed in claim 1, in which the condenser is generally flat and includes a tubular arrangement of an elongate pipe formed into a plurality of U-shaped formations arranged to provide a thermosyphon effect for the efficient cooling of the dielectric fluid in the condenser.

5. A heat dissipation apparatus as claimed in claim 1, in which the evaporator is manufactured from copper or aluminum and has an internal fluid path for the dielectric fluid.

6. A heat dissipation apparatus as claimed in claim 5, in which the evaporator is clamped to the primary contact toes by means of at least one nut and bolt extending through an orifice in the evaporator.

7. A method of dissipating heat from an air circuit breaker (ACB) switchgear having at least one primary pair of contact toes constructed and arranged to connect to the terminal of a circuit breaker, with a bus bar joint being connected to the primary contact toes, the method comprising the steps of:
    clamping an evaporator to the primary contact toes,
    providing a condenser located at a higher elevation than the evaporator;
    providing at least two electrically isolating pipes fluidly connecting the evaporator with the condenser;
    providing a dielectric fluid in the evaporator, the dielectric fluid being non-hazardous (UL listed), chemically stable, suitable for two phase applications, have a crucial temperature −200° C. and chemically compatible with copper and a dielectric and UL listed material; and
    transferring heat from the primary contact toes to the dielectric fluid to cause the dielectric fluid to evaporate in the evaporator with the evaporated vapour being delivered to the condenser via one of the pipes and returning the dielectric fluid that condenses in the condenser back to the evaporator via the second pipe, wherein the evaporator is manufactured from a single solid block of metal and has an internal fluid path for the dielectric fluid that is defined by cross-hatched channels fabricated by drilling partially through the evaporator block from a top side to one side.

8. A method of dissipating heat from an air circuit breaker (ACB) switchgear as claimed in claim 7, in which the condenser includes a plurality of fins in spaced relation, with the fins being arranged to transfer heat from the condenser to surrounding air by natural convention.

9. A method for dissipating heat from an air circuit breaker (ACB) switchgear as claimed in claim 8, in which the fins of the condenser are metal and disposed substantially parallel to one another.

10. A method of dissipating heat from an air circuit breaker (ACB) switchgear as claimed in claim 7, in which the air condenser is generally flat and includes a tubular arrangement of an elongate pipe formed into a plurality of U-shaped formations arranged to provide a thermosyphon effect for the efficient cooling of the dielectric fluid in the condenser.

11. A method of dissipating heat from an air circuit breaker (ACB) switchgear as claimed in claim 7, the evaporator is manufactured from copper or aluminum and has an internal fluid path for the dielectric fluid.

12. A method of dissipating heat as claimed in claim 11, characterized by clamping the evaporator to the primary contact toes by means of at least one nut and bolt extending through an orifice in the evaporator.

* * * * *